United States Patent
Ho et al.

(10) Patent No.: US 7,595,218 B2
(45) Date of Patent: Sep. 29, 2009

(54) PROGRAMMABLE RESISTIVE RAM AND MANUFACTURING METHOD

(75) Inventors: ChiaHua Ho, Kaohsiung (TW); Erh Kun Lai, Taichung County (TW); Kuang Yeu Hsieh, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 74 days.

(21) Appl. No.: 11/461,103

(22) Filed: Jul. 31, 2006

(65) Prior Publication Data
US 2007/0158690 A1 Jul. 12, 2007

Related U.S. Application Data

(60) Provisional application No. 60/757,366, filed on Jan. 9, 2006.

(51) Int. Cl.
H01L 21/00 (2006.01)
(52) U.S. Cl. .................. 438/95; 438/211; 438/238; 438/257; 438/382; 257/E21.646; 257/E21.665; 257/E31.029
(58) Field of Classification Search ............ 438/95, 438/211, 238, 257, 382, FOR. 212, FOR. 220, 438/637, 638; 257/390, 529, E21.646, E21.665, 257/E31.029, E21.579
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| RE35,232 E | 5/1996 | Stephens, Jr. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,920,788 A | 7/1999 | Reinberg | |

(Continued)

FOREIGN PATENT DOCUMENTS

CN 1574410 A 2/2005

(Continued)

OTHER PUBLICATIONS

Adler, David, "Amorphous-Semiconductor Devices," Sci. Amer., vol. 236, pp. 36-48, May 1977.

(Continued)

*Primary Examiner*—Michelle Estrada
(74) *Attorney, Agent, or Firm*—Kenta Suzue; Haynes Beffel & Wolfeld LLP

(57) ABSTRACT

Programmable resistive RAM cells have a resistance that depends on the size of the programmable resistive elements. Manufacturing methods and integrated circuits for programmable resistive elements with uniform resistance are disclosed that have a cross-section of reduced size compared to the cross-section of the interlayer contacts.

22 Claims, 6 Drawing Sheets

U.S. PATENT DOCUMENTS

| | | | |
|---|---|---|---|
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A * | 2/2000 | Sandhu | 438/237 |
| 6,031,287 A | 2/2000 | Harshfield | |
| 6,034,882 A | 3/2000 | Johnson et al. | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,744,088 B1 | 6/2004 | Dennison | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,815,704 B1 | 11/2004 | Chen | |
| 6,830,952 B2 | 12/2004 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,888,750 B2 | 5/2005 | Walker et al. | |
| 6,894,304 B2 * | 5/2005 | Moore | 257/4 |
| 6,894,305 B2 | 5/2005 | Yi et al. | |
| 6,903,362 B2 | 6/2005 | Wyeth et al. | |
| 6,909,107 B2 | 6/2005 | Rodgers et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 | 8/2005 | Chen | |
| 6,992,932 B2 | 1/2006 | Cohen | |
| 7,023,009 B2 | 4/2006 | Kostylev et al. | |
| 7,033,856 B2 | 4/2006 | Lung et al. | |
| 7,042,001 B2 | 5/2006 | Kim et al. | |
| 7,067,865 B2 | 6/2006 | Lung et al. | |
| 7,126,149 B2 | 10/2006 | Iwasaki et al. | |
| 7,132,675 B2 | 11/2006 | Gilton | |
| 7,164,147 B2 * | 1/2007 | Lee et al. | 257/4 |
| 7,166,533 B2 | 1/2007 | Happ | |
| 7,214,958 B2 | 5/2007 | Happ | |
| 7,220,983 B2 | 5/2007 | Lung | |
| 2002/0072223 A1 | 6/2002 | Gilbert et al. | |
| 2002/0113273 A1 | 8/2002 | Hwang et al. | |
| 2004/0051094 A1 | 3/2004 | Ooishi | |
| 2004/0178172 A1 | 9/2004 | Huang et al. | |
| 2004/0248339 A1 | 12/2004 | Lung | |
| 2005/0029502 A1 | 2/2005 | Hudgens | |
| 2005/0093022 A1 | 5/2005 | Lung | |
| 2005/0106919 A1 | 5/2005 | Layadi et al. | |
| 2005/0110983 A1 | 5/2005 | Jeong et al. | |
| 2005/0130414 A1 | 6/2005 | Choi et al. | |
| 2005/0167656 A1 | 8/2005 | Sun et al. | |
| 2005/0201182 A1 | 9/2005 | Osada et al. | |
| 2005/0212024 A1 | 9/2005 | Happ | |
| 2005/0215009 A1 | 9/2005 | Cho | |
| 2005/0285096 A1 | 12/2005 | Kozicki | |
| 2006/0091476 A1 | 5/2006 | Pinnow et al. | |
| 2006/0108667 A1 | 5/2006 | Lung | |
| 2006/0110878 A1 | 5/2006 | Lung et al. | |
| 2006/0118913 A1 | 6/2006 | Yi et al. | |
| 2006/0175599 A1 | 8/2006 | Happ | |
| 2006/0226409 A1 | 10/2006 | Burr et al. | |
| 2006/0234138 A1 | 10/2006 | Fehlhaber et al. | |
| 2006/0284157 A1 | 12/2006 | Chen et al. | |
| 2006/0284158 A1 | 12/2006 | Lung et al. | |
| 2006/0284214 A1 | 12/2006 | Chen | |
| 2006/0284279 A1 | 12/2006 | Lung et al. | |
| 2006/0286709 A1 | 12/2006 | Lung et al. | |
| 2006/0286743 A1 | 12/2006 | Lung et al. | |
| 2007/0019836 A1 | 1/2007 | Thorwirth | |
| 2007/0030721 A1 | 2/2007 | Segal et al. | |
| 2007/0037101 A1 | 2/2007 | Morioka | |
| 2007/0096162 A1 | 5/2007 | Happ et al. | |
| 2007/0108077 A1 | 5/2007 | Lung et al. | |
| 2007/0108429 A1 | 5/2007 | Lung | |
| 2007/0108430 A1 | 5/2007 | Lung | |
| 2007/0108431 A1 | 5/2007 | Chen et al. | |
| 2007/0109836 A1 | 5/2007 | Lung | |
| 2007/0109843 A1 | 5/2007 | Lung et al. | |
| 2007/0111429 A1 | 5/2007 | Lung | |
| 2007/0115794 A1 | 5/2007 | Lung | |
| 2007/0117315 A1 | 5/2007 | Lai et al. | |
| 2007/0121363 A1 | 5/2007 | Lung | |
| 2007/0121374 A1 | 5/2007 | Lung et al. | |
| 2007/0126040 A1 | 6/2007 | Lung | |
| 2007/0131922 A1 | 6/2007 | Lung | |
| 2007/0131980 A1 | 6/2007 | Lung | |

| | | | |
|---|---|---|---|
| 2007/0138458 | A1 | 6/2007 | Lung |
| 2007/0147105 | A1 | 6/2007 | Lung et al. |
| 2007/0154847 | A1 | 7/2007 | Chen et al. |
| 2007/0155172 | A1 | 7/2007 | Lai et al. |
| 2007/0158632 | A1 | 7/2007 | Ho |
| 2007/0158633 | A1 | 7/2007 | Lai et al. |
| 2007/0158645 | A1 | 7/2007 | Lung |
| 2007/0158690 | A1 | 7/2007 | Ho et al. |
| 2007/0158862 | A1 | 7/2007 | Lung |
| 2007/0161186 | A1 | 7/2007 | Ho |
| 2007/0173019 | A1 | 7/2007 | Ho et al. |
| 2007/0173063 | A1 | 7/2007 | Lung |
| 2007/0176261 | A1 | 8/2007 | Lung |
| 2007/0235811 | A1* | 10/2007 | Furukawa et al. ........... 257/359 |
| 2007/0257300 | A1 | 11/2007 | Ho et al. |
| 2007/0298535 | A1 | 12/2007 | Lung |
| 2008/0014676 | A1 | 1/2008 | Lung et al. |

FOREIGN PATENT DOCUMENTS

| | | |
|---|---|---|
| CN | 1622360 A | 6/2005 |
| WO | WO 00/45108 A1 | 8/2000 |
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, AN et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3$^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43$^{rd}$ Annual International Reliability Physics Symposium, San Jose, 2005, pp. 157-162.

Kojima, Rie et al., "Ge—Sn—Sb—Te Phase-change Recording Material Having High Crystallization Sheet," Proceedings of PCOS 2000, pp. 38-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era—vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contect Cell Technology for 256Mb PRAM," VLSI Technology, Digest of Technical Papers, Jun. 14-16, 2005, pp. 98-99.

Gibson, G. A. et al, "Phase-change Recording Medium that Enables Ultrahigh-density Electron-beam Data Storage," Applied Physics Letter, 2005, 3 pp., vol. 86.

Hudgens, S. et al., "Overview of Phase-Change Chalcogenide Nonvolatile Memory Technology," MRS Bulletin, Nov. 2004, pp. 829-832.

"Magnetic Bit Boost," www.sciencenews.org <http://www.sciencenews.org>, Dec. 18 & 25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design", IPCOM000141986D, IP.com Prior Art Database, Oct. 18, 2006, 4 pp.

Pirovano, Agostino et al., "Reliability Study of Phase-Change Nonvolatile Memories," IEEE Transactions on Device and Materials Reliability, Sep. 2004, pp. 422-427, vol. 4, No. 3.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

"Thermal Conductivity of Crystalline Dielectrics" in CRC Handbook of Chemistry and Physics, Internet Version 2007, (87th edition), David R. Lide, ed. Taylor and Francis, Boca Raton, FL.

Wuttig, Matthias, "Towards a Universal Memory?" Nature Materials, Apr. 2005, pp. 265-266, vol. 4.

* cited by examiner

PROGRAMMABLE RESISTIVE RAM AND MANUFACTURING METHOD

REFERENCE TO RELATED APPLICATION

This application claims the benefit of U.S. Provisional Patent Application No. 60/757,366, filed 9 Jan. 2006 by inventors ChiaHua Ho, Erh-Kun Lai and Kuang Yeu Hsieh entitled *Process of Self-Align Formation of Bistable Resistance Random Access Memory*.

BACKGROUND OF THE INVENTION

1. Field of the Invention

The invention relates to integrated circuit nonvolatile memory. In particular, the invention relates to programmable resistive nonvolatile memory, such as phase change memory.

2. Description of Related Art

Nonvolatile memory stores data without requiring a continuous supply of power. Programmable resistive memory such as phase change memory is an example of nonvolatile memory. A high current reset electrical pulse melts and quenches the programmable resistive element into an amorphous state, raising the resistance of the programmable resistive element. A low current set electrical pulse crystallizes and lowers the resistance of the programmable resistive element.

Because the electrical pulse type determines the data that are stored in the programmable resistive RAM, and the size of the programmable resistive RAM cells helps to determine characteristics of the electrical pulse, it is critical to manufacture the programmable resistive RAM cells with the appropriate size.

Generally, a smaller programmable resistive RAM cell is associated with electrical pulses of lower magnitude. Accordingly, a smaller programmable resistive RAM cell is associated with decreased power consumption. A traditional solution to forming small programmable resistive RAM cells is to rely on a photolithographic mask that defines the small cell. However, such a mask is associated with accompanying problems, such as proper alignment of the mask with the already fabricated layers of the planar integrated circuit.

Therefore, it would be desirable to manufacture small programmable resistive RAM cells while relying less on aggressive photolithography masks to define the small cells.

SUMMARY OF THE INVENTION

Embodiments of the technology include an integrated circuit with nonvolatile memory cells. The integrated circuit includes conductive rows accessing the nonvolatile memory cells by row, dielectric layers above the conductive rows, programmable resistive elements of the nonvolatile memory cells, interlayer contacts having a substantially uniform cross-section through the dielectric layers to conductively connect programmable resistive elements with the conductive rows, and conductive columns accessing the nonvolatile memory cells by column.

The programmable resistive elements have a cross-section smaller than the cross-section of the interlayer contacts. One end of the programmable resistive elements is adjacent to the interlayer contacts, and the other end of the programmable resistive elements is adjacent to the conductive columns.

Other embodiments of the technology include a method of forming an integrated circuit with nonvolatile memory cells, as described herein. In some embodiments, the step of forming interlayer contacts, includes removing upper portions of the interlayer contacts to leave openings having a substantially uniform cross-section. These openings are at least partly filled by the step of forming the programmable resistive elements.

Other embodiments of the technology include another method of forming an integrated circuit with nonvolatile memory cells. The method includes the following steps:

The step of forming conductive rows accessing the nonvolatile memory cells by row.

The step of forming dielectric layers above conductive rows.

The step of forming interlayer contacts having a substantially uniform cross-section through the dielectric layers to conductively connect programmable resistive elements with the conductive rows, which includes the following steps.

The step of forming the interlayer contacts having the substantially uniform cross-section.

Some embodiments include the step of removing a dielectric layer until exposing at least part of another dielectric layer, thereby exposing at least part of the upper portions of the interlayer contacts. These two dielectric layers have an etching selectivity difference.

Some embodiments include the step of forming sidewall structures adjacent to at least part of the upper portions of the interlayer contacts, which includes the following steps:

The step of forming a dielectric layer covering and lying adjacent to the upper portions of the interlayer contacts. An etching selectivity difference exists between this dielectric layer and the dielectric layer removed to expose the upper portions of the interlayer contacts.

The step of removing excess material of this dielectric layer, leaving the sidewall structures.

The step of removing upper portions of the interlayer contacts to leave openings having the substantially uniform cross-section, whereby the openings are to be filled by the programmable resistive elements. In some embodiments, the upper portions being removed are adjacent to at least one interface between two dielectric layers having an etching selectivity difference, such that a lower layer of the two layers is an etch stop of an upper layer of the two layers. In some embodiments, the upper portions being removed are adjacent to a dielectric layer, such that the interlayer contacts and the first dielectric layer have an etching selectivity difference, and the dielectric layer resists removal during removal of the upper portions of the interlayer contacts.

The step of, prior to said forming the programmable resistive elements, forming dielectric liner in the openings left from the step of removing the upper portions of the interlayer contacts, and optionally over a dielectric layer as well. Optionally, the following steps are included.

The step of forming the dielectric liner in the openings. The dielectric liner and the interlayer contacts have an etching selectivity difference. An etching selectivity difference also exists between the dielectric liner and the dielectric layer over which the liner was formed, such that the dielectric layer acts as an etch stop during removal of the liner.

The step of removing at least part of the dielectric liner in the openings to at least partly expose the interlayer contacts, and optionally the dielectric layer over which the liner was formed.

The step of forming the programmable resistive elements of the nonvolatile memory cells in the openings left from the step of removing the upper portions of the interlayer contacts. Examples of programmable resistive elements are a chalcogenide, $Pr_xCa_yMnO_3$, $Pr_xSr_yMnO_3$, $ZrO_x$, a two-element memory compound, TCNQ, and PCBM. The programmable resistive elements have a cross-section smaller than the cross-section of the interlayer contacts, a first end adjacent to the interlayer contacts, and a second end adjacent to the conductive columns. The following steps are optionally included:

The step of depositing programmable resistive material to partly fill the openings narrowed by the dielectric liner.

The step of removing the dielectric layers at least until the programmable resistive elements are substantially level with surrounding dielectric material. In some embodiments, this is performed by removing a dielectric layer until exposing at least part of another dielectric layer having a polishing sensitivity difference.

The step of forming conductive columns accessing the nonvolatile memory cells by column, such that the conductive columns are adjacent to the programmable resistive elements.

In some embodiments, the method, or one or more of the steps, is a self-aligned process, such as the step of removing the upper portions of the interlayer contacts, and/or the step of forming the programmable resistive elements. The self-aligned feature reduces cost by reducing the number or precision of photolithographic masks, and correspondingly raises product yield.

DETAILED DESCRIPTION

Various embodiments are directed at a manufacturing method for memory, such as nonvolatile embedded memory implementing programmable resistance RAM. Examples of resistance device RAM are resistance memory (RRAM), polymer memory, and phase change memory (PCRAM). The programmable resistive elements are formed to have a cross-section small than the cross-section of the upper portion of the interlayer contacts of programmable resistance RAM.

Figure 1:
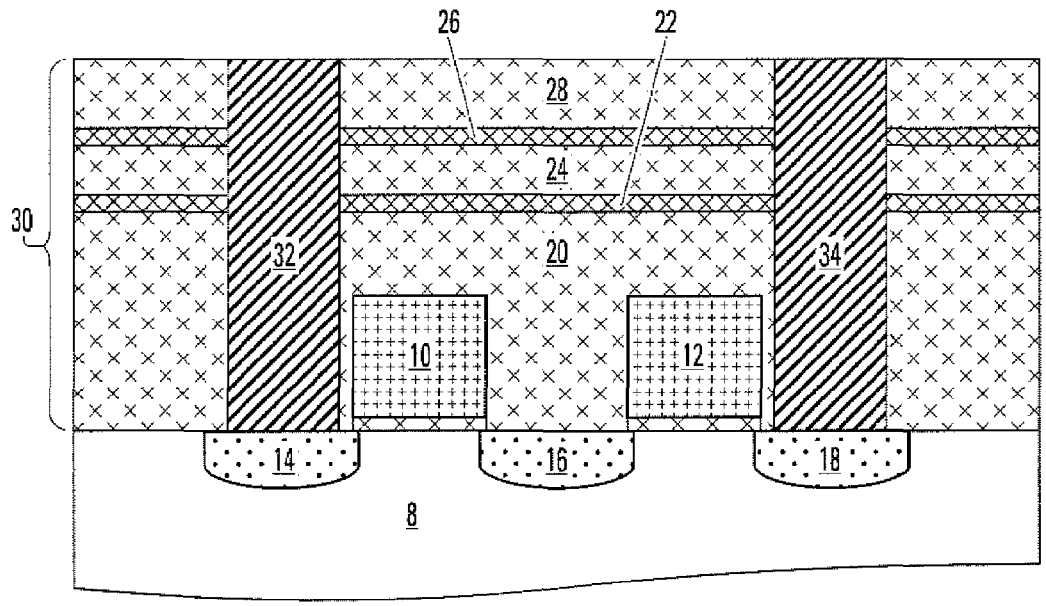
FIG. 1 is a cross-sectional view during the manufacturing process that shows the formation of the transistor circuitry, multiple dielectric layers, and interlayer contacts.

FIG. 1 is a cross-sectional view during the manufacturing process that shows the formation of the transistor circuitry, multiple dielectric layers, and interlayer contacts.

The substrate 8 (which may also be an n-well or p-well) has source and drain regions 14, 16, and 18. The gates 10 and 12 are conductive rows which selectively access the programmable resistive RAM cells, and induce a channel under the respective regions of the substrate 8 under the gates 10 and 12, between regions 14 and 16 and regions 16 and 18. Dielectric layers 20, 22, 24, 26, and 28 cover the substrate 8 and the gates 10 and 12. Interlayer contacts 32 and 34 physically and electrically connect to regions 14 and 18 through dielectric layers 20, 22, 24, 26, and 28. Example materials of dielectric layer 20, 24, and 28 are oxides such as $SiO_x$ and low-k material, and other dielectric materials associated with transistor fabrication. An example thickness of dielectric layer 20 is 600 nm, and an example thickness range of dielectric layers 24 and 28 is 100-200 nm. An example material of dielectric layers 22 and 26 is SiN, and an example thickness of dielectric layers 22 and 26 is 30 nm. Example materials of interlayer contacts 32 and 34 are W, polycrystalline Si without doping or with p or n doping (such as n+ doped polycrystalline Si).

Figure 2:
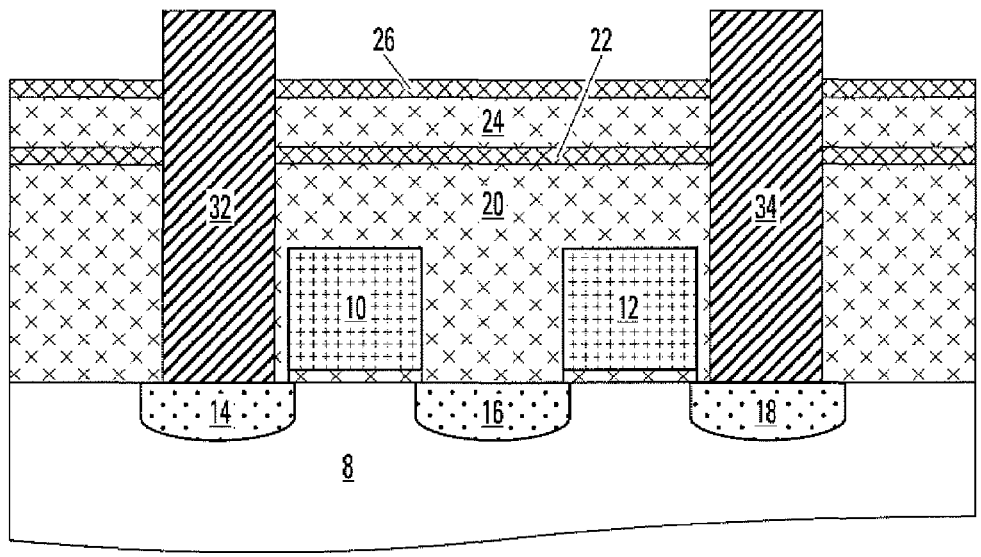
FIG. 2 is a cross-sectional view during the manufacturing process that shows the removal of an upper dielectric layer to expose part of the upper portions of the interlayer contacts.

FIG. 2 is a cross-sectional view during the manufacturing process that shows the removal of an upper dielectric layer to expose part of the upper portions of the interlayer contacts, stopping on the next layer of dielectric.

Dielectric layer 28 is removed, exposing dielectric layer 26 and an upper portion of the interlayer contacts 32 and 34. Wet etching, dry etching, or some combination of wet etching and dry etching, are alternative methods to remove dielectric layer 28. One example is wet etching with dilute HF (DHF) or buffer HF (BHF) to wet etch silicon oxide. The etching selective difference between dielectric layer 26 and dielectric layer 28 is sufficiently high, such that the removal of material stops at dielectric layer 26.

Figure 3:
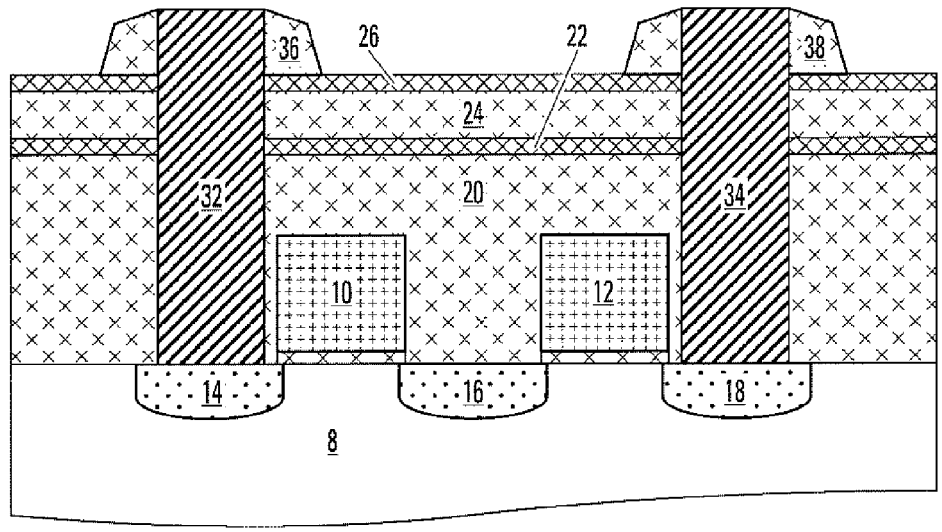
FIG. 3 is a cross-sectional view during the manufacturing process that shows the formation of the sidewall structures adjacent to the upper portions of the interlayer contacts.

FIG. 3 is a cross-sectional view during the manufacturing process that shows the formation of the sidewall structures adjacent to the upper portions of the interlayer contacts.

High-density plasma (HDP) oxide layer is formed, and then etched to leave sidewall structures 36 and 38. The etching selectivity difference between the SiO2 oxide and the dielectric layer 26, as well as the etching selectivity difference between the SiO2 oxide and the contacts 32 and 34, are sufficient to selectively remove the excess portions of the SiO2 oxide, without undue etching of either the dielectric layer 26 or the contacts 32 and 34.

Example method of etching is wet etching, dry etching, or some combination of wet etching and dry etching. In one example, dilute HF (DHF) or buffer HF (BHF) are used to wet etch the silicon oxide layer to leave sidewall structures 36 and 38.

Figure 4:
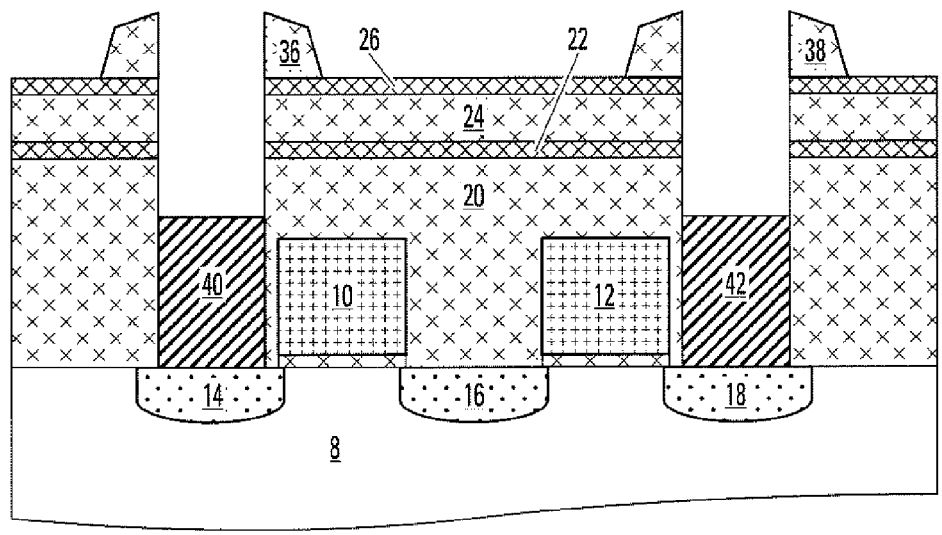
FIG. 4 is a cross-sectional view during the manufacturing process that shows the removal of the upper portions of the upper portions of the interlayer contacts.

FIG. 4 is a cross-sectional view during the manufacturing process that shows the removal of the upper portions of the upper portions of the interlayer contacts.

Wet etching, dry etching, or some combination of wet etching and dry etching, are alternative methods. In one example, $SF_6$ based chemistry is used to dry etch the contacts 32 and 34. The etching selectivity difference between contacts 32 and 34, and structures 36 and 38, is sufficiently high to prevent significant etching of structures 36 and 38. Similarly, the etching selectivity difference between contacts 32 and 34, and dielectric layers 20, 22, 24, and 26, is sufficiently high to prevent significant etching of structures 20, 22, 24, and 26. The etching time is controlled to etch the contacts 32 and 34 to around 100 ~500 nm, such as below the dielectric layer 22, for example about 50 nm below dielectric layer 22. Contacts 32 and 34 have been etched to contacts 40 and 42 with shorter heights.

Figure 5:
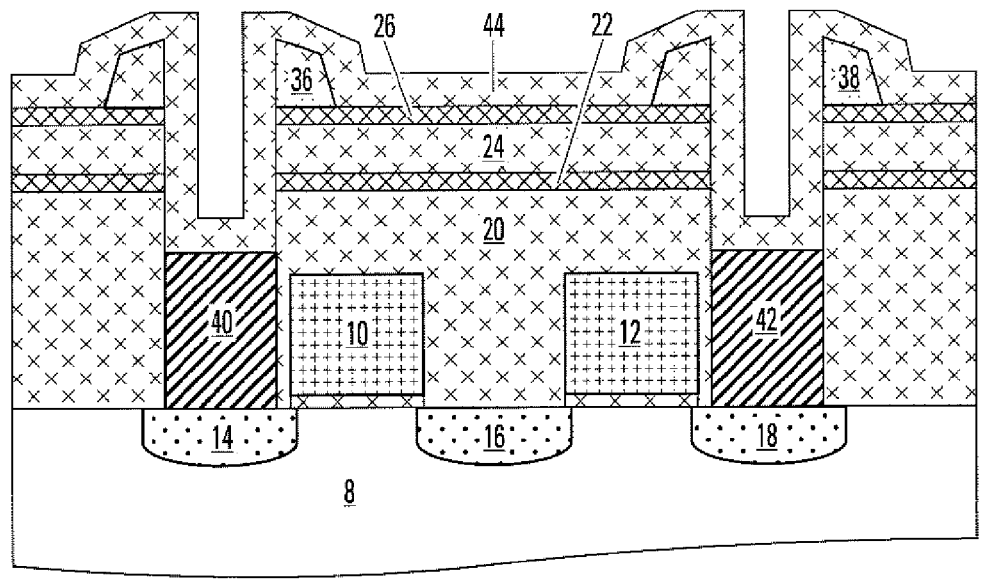
FIG. 5 is a cross-sectional view during the manufacturing process that shows the formation of the dielectric liner in the openings left from removing the upper portions of the interlayer contacts.

FIG. 5 is a cross-sectional view during the manufacturing process that shows the formation of the dielectric liner in the openings left from removing the upper portions of the interlayer contacts.

Dielectric liner 44 is substantially conformal with the exposed surface of the integrated circuit. An example material of dielectric liner 44 is silicon oxide deposited by CVD, which has low thermal conductivity.

Figure 6:
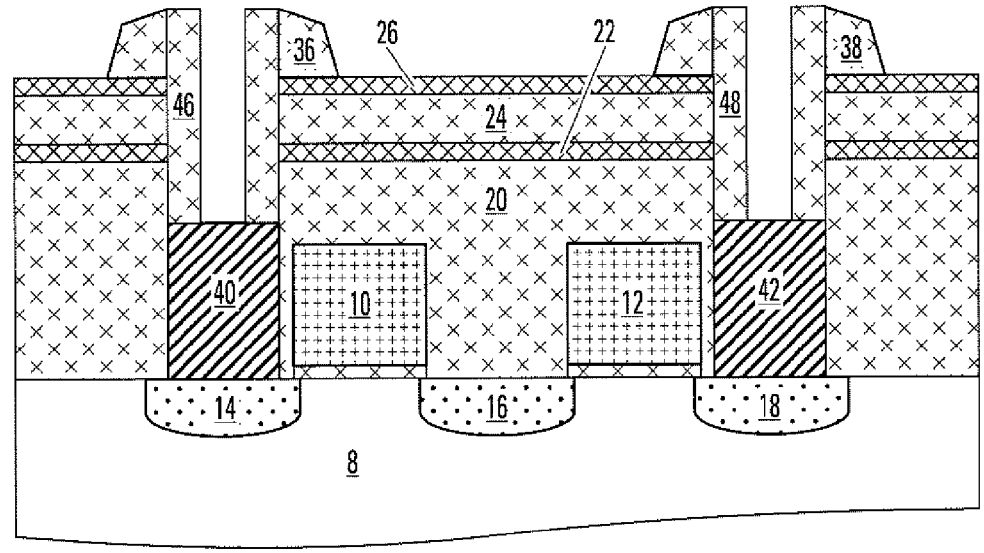
FIG. 6 is a cross-sectional view during the manufacturing process that shows removal of the dielectric liner portion covering the interlayer contacts.

FIG. 6 is a cross-sectional view during the manufacturing process that shows removal of the dielectric liner portion covering the interlayer contacts.

The dielectric liner 44 is etched anisotropically. Inside the openings 46,48 formed by removal of the upper portions of the interlayer contacts, the anisotropic etch stops on the interlayer contacts 40 and 42. Outside the openings formed by removal of the upper portions of the interlayer contacts, the anisotropic etch stops on dielectric layer 26.

Figure 7:
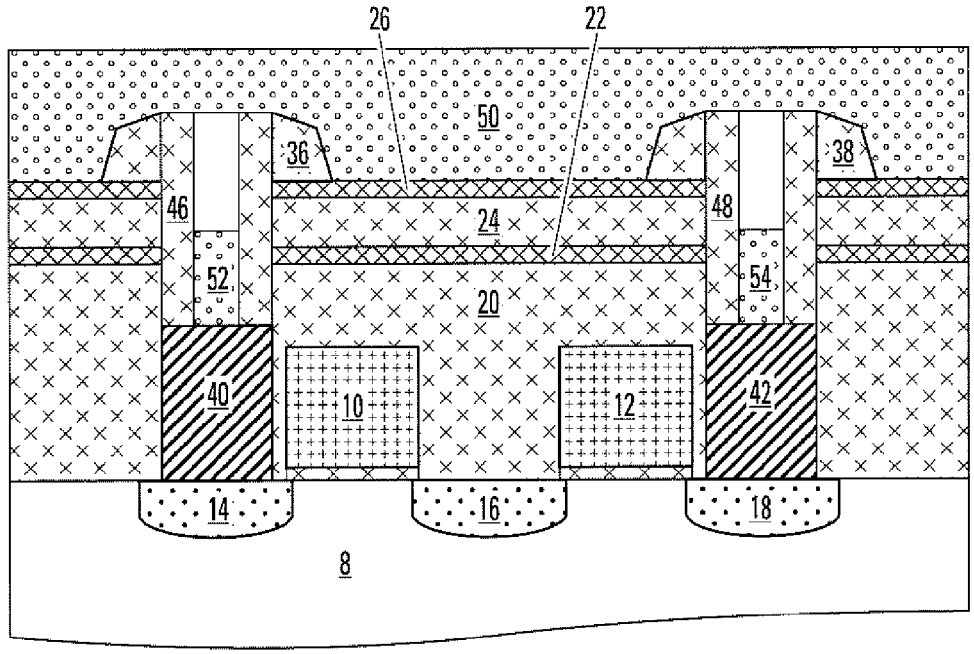
FIG. 7 is a cross-sectional view during the manufacturing process that shows the formation of the programmable resistive material in the openings left from removing the upper portions of the interlayer contacts.

FIG. 7 is a cross-sectional view during the manufacturing process that shows the formation of the programmable resistive material 50 in the openings left from removing the upper portions of the interlayer contacts.

The programmable resistive elements 52 and 54 physically and electrically connect with interlayer contacts 40 and 42.

Embodiments of the memory cell include phase change based memory materials, including chalcogenide based materials and other materials, for the resistive elements 52 and 54. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including N2 doped GST, GexSby, or other material that uses different crystal phase changes to determine resistance; $Pr_xCa_yMnO_3$, $Pr_xSr_yMnO_3$, $ZrO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has bistable or multi-stable resistance state controlled by an electrical pulse.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimater with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post deposition treatment condition. A collimater with an aspect ratio of 1~5 can be used to improve the fill-in performance. To improve the fill-in performance, the DC bias of several tens of volts to several hundreds of volts is also used. On the other hand, the combination of DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an N2 ambient or O2/N2 mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO ($YBaCuO_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zr_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers, There are no reactive chemistries or gases. The deposition is done at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer held (typically at room temperature or temperature less than 200° C.) for a time sufficient for solid-state formation. The hold time ranges from several minutes to days, depending on the temperature and on the formation conditions.

Figure 8:
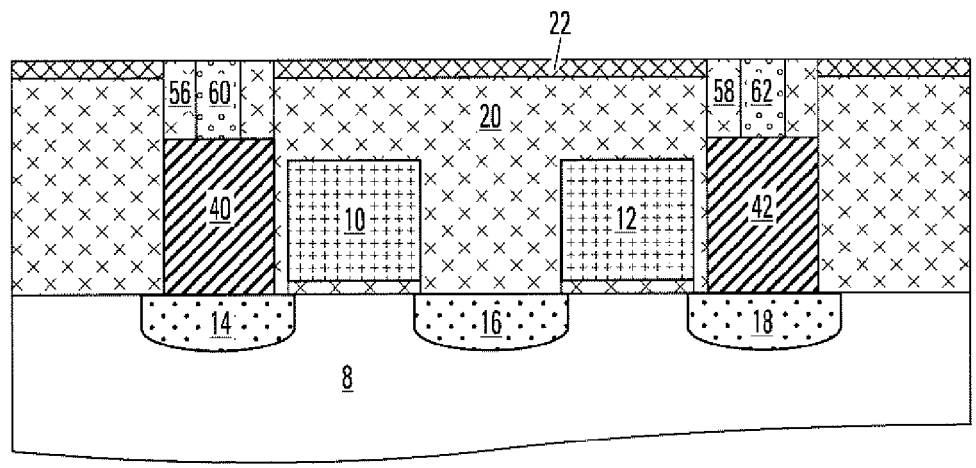
FIG. 8 is a cross-sectional view during the manufacturing process that shows removal of the upper layers of the integrated circuit.

FIG. 8 is a cross-sectional view during the manufacturing process that shows removal of the upper layers of the integrated circuit.

Chemical mechanical polishing (CMP) planarizes the surface down to the dielectric layer 22, removing dielectric layers 26 and 24. Parts of the dielectric liner 46 and 48 exceeding the height of dielectric layer 22 are removed, leaving dielectric liner 56 and 58. Parts of the programmable resistive material 52 and 54 exceeding the height of dielectric layer 22 are removed, leaving programmable resistive material 60 and 62. The CMP stops at dielectric layer 22, due to a high selectivity slurry such as $CeO_2$, etc., and/or a different end-point or signal point between the polished materials. The CMP process therefore results in all the programmable resistive elements such as 60 and 62 having the same height, which has the benefit of a low resistance variation across the different nonvolatile memory cells, regardless of the stored logic state.

Figure 9:
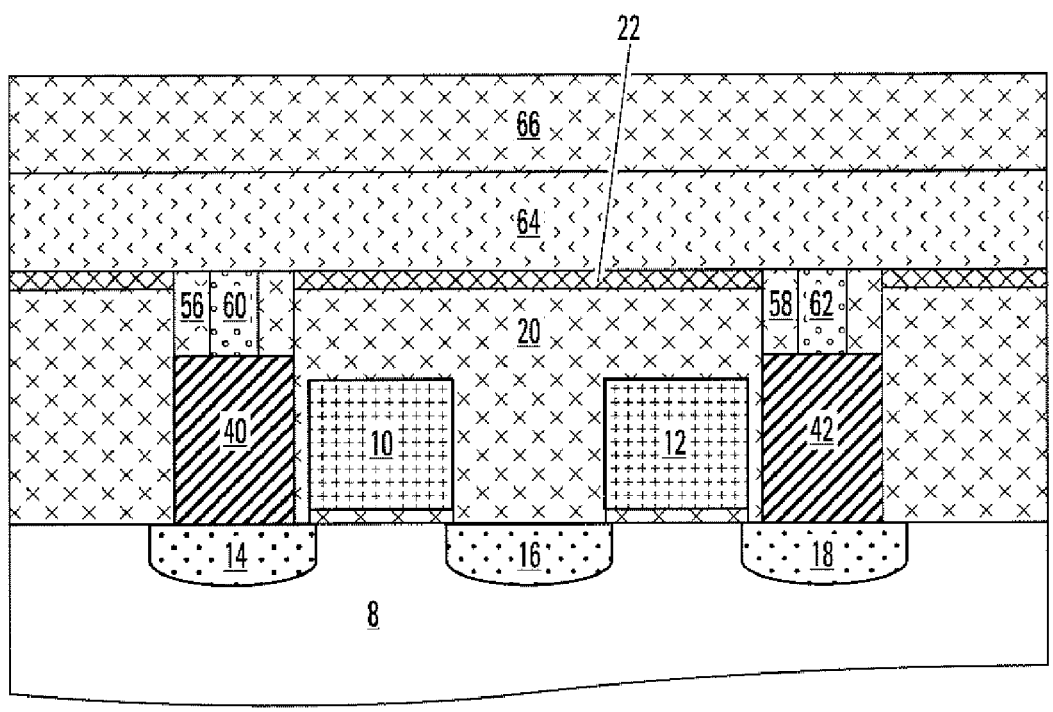
FIG. 9 is a cross-sectional view during the manufacturing process that shows the formation of the bit lines and upper dielectric layer.

FIG. 9 is a cross-sectional view during the manufacturing process that shows the formation of the bit lines and upper dielectric layer.

Metal bit lines 64 that access the programmable resistive RAM cells by column are deposited. Example materials for the metal bit lines 64 are TiN/AlCu/Ti/TiN, TaN/CU, and TiN/W. An all Cu process is another alternative. Intermetal dielectric 66 is deposited, which can be silicon oxide, HDP oxide, plasma enhanced (PE) oxide, etc.

Figure 10:
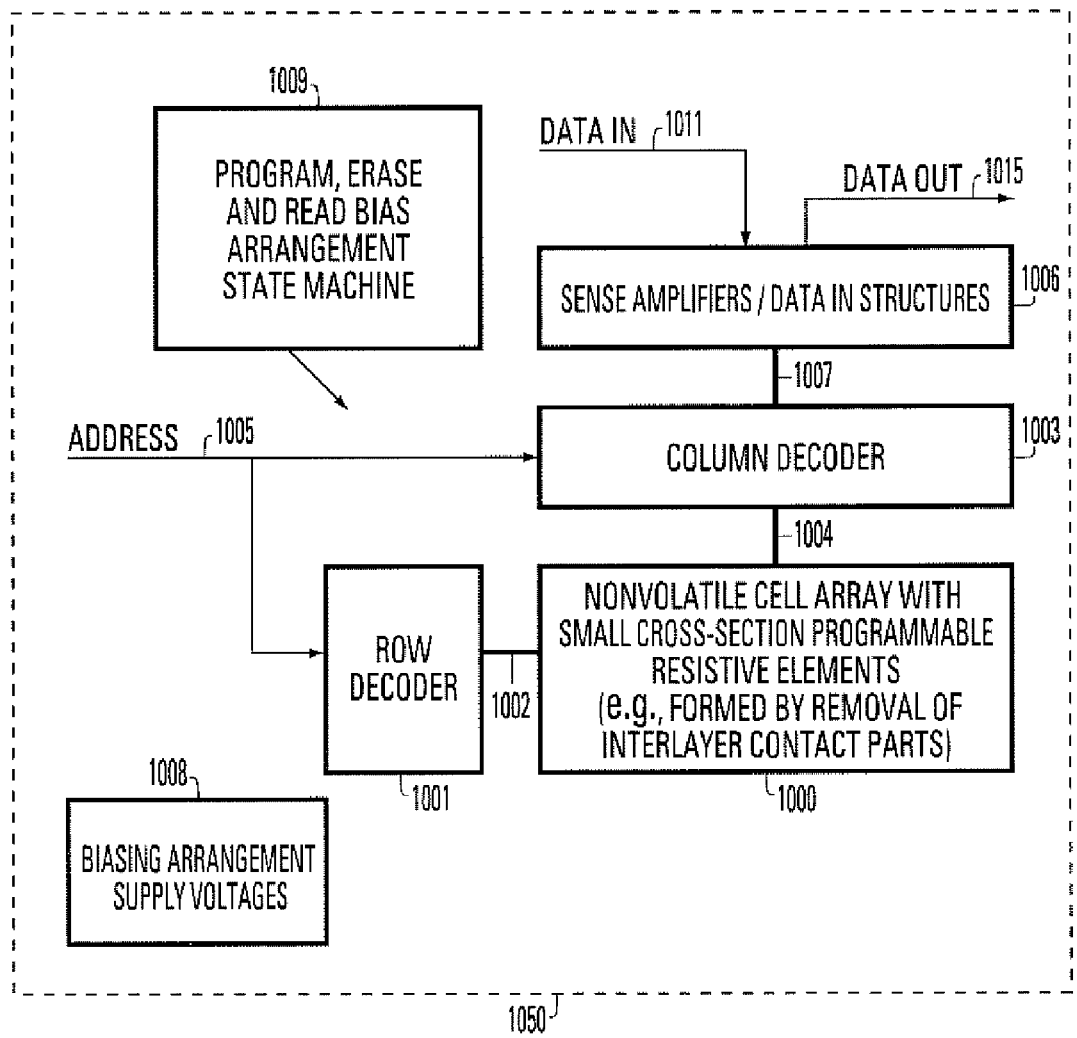
FIG. 10 is a block diagram of the integrated circuit including an array of nonvolatile programmable resistive memory cells, and other circuitry.

FIG. 10 is a block diagram of the integrated circuit including an array of nonvolatile programmable resistive memory cells, and other circuitry.

The integrated circuit 1050 includes a memory array 1000 implemented using memory cells with resistive elements on a semiconductor substrate. The resistive elements have a small-cross-section, and are formed partly by the removal of the upper portions of the interlayer contacts, as described herein. Addresses are supplied on bus 1005 to column decoder 1003 and row decoder 1001. Sense amplifiers and data-in structures in block 1006 are coupled to the column decoder 1003 via data bus 1007. Data is supplied via the data-in line 1011 from input/output ports on the integrated circuit 1050, or from other data sources internal or external to the integrated circuit 1050, to the data-in structures in block 1006. Data is supplied via the data-out line 1015 from the block 1006 to input/output ports on the integrated circuit 1050, or to other data destinations internal or external to the integrated circuit 1050. The integrated circuit 1050 may also include circuitry directed a mission function other than the nonvolatile storage with resistive elements (not shown). Bias arrangement state machine 1009 controls the application of bias arrangement supply voltages.

Terms describe positions of layers with respect to each other are relative unless otherwise specified. For example, a layer "covers" another layer or is "above" another layer, even in the presence of an intervening layer (e.g., between the covering layer and the covered layer, or between the "above" layer and the "below" layer. A layer is "between" two other layers, regardless of any intervening layers on either side.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of forming an integrated circuit with nonvolatile memory cells, comprising:
    forming conductive rows accessing the nonvolatile memory cells by row;
    forming one or more dielectric layers above said conductive rows;
    forming interlayer contacts having a uniform cross-section through the one or more dielectric layers to conductively connect programmable resistive elements with the conductive rows, including:
        removing upper portions of the interlayer contacts to leave openings having the uniform cross-section, said openings at least partly filled by said forming the programmable resistive elements;
    forming the programmable resistive elements of the nonvolatile memory cells, the programmable resistive elements having a cross-section smaller than the cross-section of the interlayer contacts, the programmable resistive elements having a first end adjacent to the interlayer contacts and a second end; and
    forming conductive columns accessing the nonvolatile memory cells by column, the conductive columns adjacent to the second ends of the programmable resistive elements.

2. A method of forming an integrated circuit with nonvolatile memory cells, comprising:
    forming conductive rows accessing the nonvolatile memory cells by row;
    forming one or more dielectric layers above said conductive rows;
    forming interlayer contacts having a uniform cross-section through the one or more dielectric layers to conductively connect programmable resistive elements with the conductive rows, including:
        forming the interlayer contacts having the uniform cross-section; and
        removing upper portions of the interlayer contacts to leave openings having the uniform cross-section, the openings to be filled by at least the programmable resistive elements;
    forming the programmable resistive elements of the nonvolatile memory cells in the openings left from said removing the upper portions of the interlayer contacts; and
    forming conductive columns accessing the nonvolatile memory cells by column, the conductive columns adjacent to the programmable resistive elements.

3. The method of claim 2, wherein said forming the programmable resistive elements is a self-aligned process.

4. The method of claim 2, wherein the programmable resistive elements have a cross-section smaller than the cross-section of the interlayer contacts, a first end adjacent to the interlayer contacts, and a second end adjacent to the conductive columns.

5. The method of claim 2, further comprising:
    prior to said forming the programmable resistive elements, forming dielectric liner in the openings left from said removing the upper portions of the interlayer contacts.

6. The method of claim 2, wherein said forming one or more dielectric layers includes:
    forming a first dielectric layer above said conductive rows; and
    forming a second dielectric layer at least partly above said first dielectric layer, wherein the first and second dielectric layers have an etching selectivity difference; and
    wherein said forming the interlayer contacts further includes:
        removing the second dielectric layer until exposing at least part of the first dielectric layer, thereby exposing at least part of the upper portions of the interlayer contacts.

7. The method of claim 2, wherein said removing the upper portions of the interlayer contacts is a self-aligned process.

8. The method of claim 2, wherein said removing the upper portions of the interlayer contacts includes:
    removing the upper portions of the interlayer contacts, the upper portions being adjacent to at least one interface between two layers of the one or more dielectric layers having an etching selectivity difference, such that a lower layer of the two layers is an etch stop of an upper layer of the two layers.

9. The method of claim 2, wherein said removing the upper portions of the interlayer contacts includes:
removing the upper portions of the interlayer contacts, the upper portions being adjacent to at least a first dielectric layer of the one or more dielectric layers, and the interlayer contacts and the first dielectric layer have an etching selectivity difference, such that the first dielectric layer resists removal during said removing.

10. The method of claim 2, wherein said forming the interlayer contacts further includes:
removing at least part of the one or more dielectric layers to expose at least part of the upper portions of the interlayer contacts and to expose a first dielectric layer of the one or more dielectric layers; and
forming sidewall structures adjacent to said at least part of the upper portions of the interlayer contacts, including:
forming a second dielectric layer covering and lying adjacent to the upper portions of the interlayer contacts, the first and second dielectric layers having a etching selectivity difference; and
removing excess material of the second dielectric layer, leaving the sidewall structures.

11. The method of claim 2, wherein said forming the interlayer contacts further includes:
removing at least part of the one or more dielectric layers to expose at least part of the upper portions of the interlayer contacts; and
forming sidewall structures adjacent to said at least part of the upper portions of the interlayer contacts; and
the method further comprises:
prior to said forming the programmable resistive elements, forming dielectric liner in the openings left from said removing the upper portions of the interlayer contacts.

12. The method of claim 2, further comprising:
prior to said forming the programmable resistive elements, forming, in a self-aligned process, dielectric liner in the openings left from said removing the upper portions of the interlayer contacts 13. The method of claim 2, further comprising:
prior to said forming the programmable resistive elements, forming dielectric liner in the openings left from said removing the upper portions of the interlayer contacts, including:
forming the dielectric liner in the openings; and
removing at least part of the dielectric liner in the openings to at least partly expose the interlayer contacts.

14. The method of claim 2, further comprising:
prior to said forming the programmable resistive elements, forming dielectric liner in the openings left from said removing the upper portions of the interlayer contacts, including:
forming the dielectric liner in the openings, wherein the dielectric liner and the interlayer contacts have a etching selectivity difference; and
removing at least part of the dielectric liner in the openings to at least partly expose the interlayer contacts.

15. The method of claim 2, wherein said forming one or more dielectric layers includes:
forming a first dielectric layer; and
the method further comprises:
prior to said forming the programmable resistive elements, forming dielectric liner and over the first dielectric layer and in the openings left from said removing the upper portions of the interlayer contacts, including:
forming the dielectric liner over the first dielectric layer and in the openings, wherein an etching selectivity difference exists between the dielectric liner and the interlayer contacts and between the dielectric liner and the first dielectric layer, such that the interlayer contacts and the first dielectric layer are etch stops during removal of the dielectric liner; and
removing at least part of the dielectric liner over the first dielectric layer and at least part of the dielectric liner in the openings to at least partly expose the interlayer contacts.

16. The method of claim 2, further comprising:
prior to said forming the programmable resistive elements, forming dielectric liner in the openings left from said removing the upper portions of the interlayer contacts; and
wherein said forming the programmable resistive elements includes:
depositing programmable resistive material to partly fill the openings narrowed by the dielectric liner.

17. The method of claim 2, wherein said forming programmable resistive elements includes:
forming programmable resistive elements including at least one of: a chalcogenide, $Pr_xCa_yMnO_3$, $Pr_xSr_yMnO_3$, $ZrO_x$, a two-element memory compound, TCNQ, and PCBM.

18. The method of claim 2, further comprising:
removing the one or more dielectric layers at least until the programmable resistive elements are level with surrounding dielectric material.

19. The method of claim 2, wherein said forming one or more dielectric layers includes:
forming a first dielectric layer above said conductive rows; and
forming a second dielectric layer at least partly above said first dielectric layer, wherein the first and second dielectric layers have a polishing sensitivity difference; and
the method further comprises:
removing the second dielectric layer until exposing at least part of the first dielectric layer, thereby removing the one or more dielectric layers at least until the programmable resistive elements are substantially level with surrounding dielectric material.

20. An integrated circuit with nonvolatile memory cells, comprising:
conductive rows accessing the nonvolatile memory cells by row;
one or more dielectric layers above said conductive rows;
interlayer contacts having a uniform cross-section through the one or more dielectric layers to conductively connect programmable resistive elements with the conductive rows;
the programmable resistive elements of the nonvolatile memory cells, the programmable resistive elements having a cross-section smaller than the cross-section of the interlayer contacts, the programmable resistive elements having:
a first end adjacent to the interlayer contacts; and
a second end; and
vias, wherein at least the interlayer contacts and the programmable resistive elements are in the vias; and
conductive columns accessing the nonvolatile memory cells by column, the conductive columns adjacent to the second ends of the programmable resistive elements.

21. A method of forming an integrated circuit with nonvolatile memory cells, comprising:
- forming conductive rows accessing the nonvolatile memory cells by row;
- forming one or more dielectric layers above said conductive rows;
- forming interlayer contacts in vias, the interlayer contacts having a uniform cross-section through the one or more dielectric layers to conductively connect programmable resistive elements with the conductive rows;
- forming the programmable resistive elements of the nonvolatile memory cells in the vias, the programmable resistive elements having a cross-section smaller than the cross-section of the interlayer contacts, the programmable resistive elements having a first end adjacent to the interlayer contacts and a second end; and
- forming conductive columns accessing the nonvolatile memory cells by column, the conductive columns adjacent to the second ends of the programmable resistive elements.

22. The method of claim 21, wherein said forming interlayer contacts includes:
- removing upper portions of the interlayer contacts to leave openings having the uniform cross-section.

* * * * *